United States Patent [19]

Coe

[11] Patent Number: 4,729,007

[45] Date of Patent: Mar. 1, 1988

[54] MERGED BIPOLAR/FIELD-EFFECT TRANSISTORS

[75] Inventor: David J. Coe, East Grinstead, England

[73] Assignee: U.S. Philips Corporation, New York, N.Y.

[21] Appl. No.: 777,066

[22] Filed: Sep. 17, 1985

[30] Foreign Application Priority Data

Sep. 19, 1984 [GB] United Kingdom ............... 8423690

[51] Int. Cl.⁴ ............................................ H01L 27/02
[52] U.S. Cl. .................................... 357/43; 357/34; 357/38; 357/44; 357/45; 357/46; 357/86
[58] Field of Search ............... 357/43, 23, 34, 38, 357/41, 44, 45, 46, 86

[56] References Cited

U.S. PATENT DOCUMENTS

| | | | |
|---|---|---|---|
| 4,441,117 | 4/1984 | Zommer | 357/43 |
| 4,547,791 | 10/1985 | Roger et al. | 357/43 |
| 4,611,235 | 9/1986 | Bhagat | 357/43 |

Primary Examiner—Edward J. Wojciehowicz
Attorney, Agent, or Firm—Robert T. Mayer; Steven R. Biren

[57] ABSTRACT

A semiconductor device having the advantages of bipolar transistor characteristics (such as a low ON resistance) and of FET characteristics (such as a rapid turnoff) can be obtained by integrating and merging together in one semiconductor body a bipolar transistor T and two or more insulated-gate FETs T1 to T4. A lateral FET T1 is formed by providing a drain region adjacent to the base region of the bipolar T and an insulated gate overlying an intermediate channel area. A further FET T3 which is of complementary conductivity type to T1 may have a source region provided in the drain region and an insulated gate over a channel area between the source region and the emitter region of T. These insulated gates are connected together, for example as a common gate grid, so permitting T1 to be turned on to extract charge from the base region of the bipolar T during turn off when T3 is turned off to interrupt the terminal connection to the emitter region of bipolar T. A vertical insulated-gate field-effect transistor T4 having the same source region as T3 may be formed in parallel with the bipolar transistor T to share the main current path through the device. A very compact power device structure can be obtained with a two-dimensional array of alternating base regions and drain regions.

9 Claims, 4 Drawing Figures 4,729,007

MERGED BIPOLAR/FIELD-EFFECT TRANSISTORS

BACKGROUND OF THE INVENTION

This invention relates to semiconductor devices comprising both a bipolar transistor and an insulated-gate field-effect transistor, particularly but not exclusively for rapid power switching applications.

The paper entitled "Design Considerations for FET-Gated Power Transistors" by D. Y. Chen and S. A. Chin, pages 144 to 149 of the 1983 IEEE Proceedings of the Power Electronic Specialist Conference, IEEE publication 0275-9306/83/0000-0144, describes a semiconductor device comprising a bipolar transistor of vertical configuration having an emitter region of one conductivity type in a base region of the opposite conductivity type. The base region is provided in a higher resistivity body portion of the one conductivity type which forms at least part of a collector region of the bipolar transistor. The device additionally comprises an insulated-gate field-effect transistor (designated as FET) connected to the base region.

A hybrid connection in a common device package of at least three semiconductor bodies (called "chips") is proposed in the Chen and Chin paper to form a so-called "FET-bipolar combination transistor configuration" having three terminals. The transistor configuration consists of the bipolar transistor $Q_1$, two FETs $Q_2$ and $Q_3$ and a zener diode Z. The FETs $Q_2$ and $Q_3$ have insulated gates connected together and individual source and drain regions which are of the same conductivity type as the emitter and collector regions of the bipolar transistor.

The FET $Q_2$ may be formed in the same semiconductor body as the bipolar transistor (as illustrated in FIG. 3 of the Chen and Chin paper) and provides current to the base region of the bipolar transistor to turn on the transistor configuration. The FET $Q_3$ which is formed in a separate semiconductor body from that of the bipolar transistor $Q_1$ provides a gateable connection to the emitter region of the bipolar transistor to open-circuit the emitter when turning off the bipolar transistor $Q_1$. The zener diode also formed in a separate semiconductor body provides a charge-extraction path from the base region of the bipolar transistor when turning off the bipolar transistor $Q_1$.

This hybrid connection of at least three semiconductor device bodies results in an expensive device arrangement. Although FET $Q_2$ may be formed in the same body as the bipolar transistor, it is not easy to form the zener diode in the same body (at least not in a compact structure). Furthermore, a disadvantage of using a zener diode for the base charge extraction is that significant transient dissipation occurs at the zener voltage during turn off.

SUMMARY OF THE INVENTION

According to the present invention there is provided a semiconductor device comprising a bipolar transistor of vertical configuration having an emitter region of one conductivity type in a base region of the opposite conductivity type, the base region being provided in a higher resistivity body portion of the one conductivity type which forms at least part of a collector region of the bipolar transistor, the device also comprising a first insulated-gate field-effect transistor connected to the base region, characterized in that the device additionally comprises a further insulated-gate field-effect transistor which is of complementary conductivity type to the first field-effect transistor and which has a source region of the one conductivity type beside the emitter region, the first field-effect transistor has a drain region of said opposite conductivity type in said body portion beside the base region and has an insulated gate overlying a channel area in a part of said body portion between the base region and the drain region, the further field-effect transistor has an insulated gate over a channel area between the emitter and source regions to provide a gateable connection between the emitter and source regions, which channel area comprises a portion of at least the base region, and the gate of the further field-effect transistor is connected to the gate of the first field-effect transistor, thus permitting the first field-effect transistor to be turned on to extract charge from the base region when the further field-effect transistor is turned off by a signal applied to its gate.

In such a semiconductor device in accordance with the invention the charge extraction from the base region is obtained by the first insulated-gate field-effect transistor, and this first FET together with the further FET which provides the gateable emitter connection are merged in a compact structure with the bipolar transistor in the same semiconductor body. The base region where it faces the drain region may function as the source of the merged first FET without requiring additional processing of the base region. The source region of the further FET may be formed in the same processing steps as the emitter region of the bipolar transistor. The device can be less expensive to manufacture than a hybrid connection of separate device bodies. Furthermore an efficient and rapid turn-off can be achieved with this compact structure of the first and further FETs merged with the respective base and emitter regions on which they operate.

Compared with a zener diode, the use of such a merged first FET for the charge extraction results in reduced dissipation during charge extraction in the turn-off phase. This charge is extracted from the base region directly to the drain region of the first FET. When the first FET is turned on to extract this base charge, the further FET is turned off because the gate of the further FET is connected to the gate of the first FET. Turning off the further FET directly interrupts the carrier flow in the underlying channel area to the emitter region and so prevents further charge carrier injection from the emitter region into the base region. The integration and merging of the base-charge extraction FET and the emitter-injection prevention FET with the respective base and emitter regions with which they perform these respective functions permits these FETs to cooperate efficiently in this manner to provide rapid turn-off of the device.

Particularly where the semiconductor device already includes an insulated-gate FET in addition to the bipolar transistor, the merged first and further FETs provided for the base charge extraction and emitter gating can be formed without requiring any additional processing steps, but merely by redesigning the mask layout.

Such a merged FET structure in accordance with the invention may be used for charge-extraction from the base region in devices where the main current path is through the bipolar transistor, but it may also be used in devices where the main current path is through a field-effect transistor which is formed in the same semiconductor body as the bipolar transistor and which may be connected in, for example, parallel with the bipolar transistor. The bipolar transistor with the base charge extraction merged FET and emitter-gating FET may even form part of a larger bipolar device structure. Thus, for example, the high resistivity body porton in which the base region is provided may be present between the base region and an underlying region of the opposite conductivity type with which the bipolar transistor forms an n-p-n-p thyristor structure.

A semiconductor device in accordance with the invention may also include other circuit elements, for example a FET which provides current to the base region of the bipolar transistor in a circuit configuration similar to that disclosed in the Chen and Chin paper, but using the merged first FET for base charge extraction and the merged further FET for emitter gating.

Thus, the first field-effect transistor may be one of a pair of first and second insulated-gate field-effect transistors which are of complementary conductivity type and which have a common gate connection to form a push-pull input stage connected to the base region of the bipolar transistor. This second field-effect transistor may be of vertical configuration having (a) a drain region formed by at least part of the collector region, (b) a source region of the one conductivity type provided in the base region and connected to the base region by a conductive connection, and (c) an insulated gate overlying a channel area of the base region between said body portion and the source region of the second field-effect transistor.

BRIEF DESCRIPTION OF THE DRAWING

These and other features in accordance with the invention will be illustrated more specifically, by way of example, in embodiments of the invention now to be described with reference to the accompanying diagrammatic drawing, in which.

Figure 1:
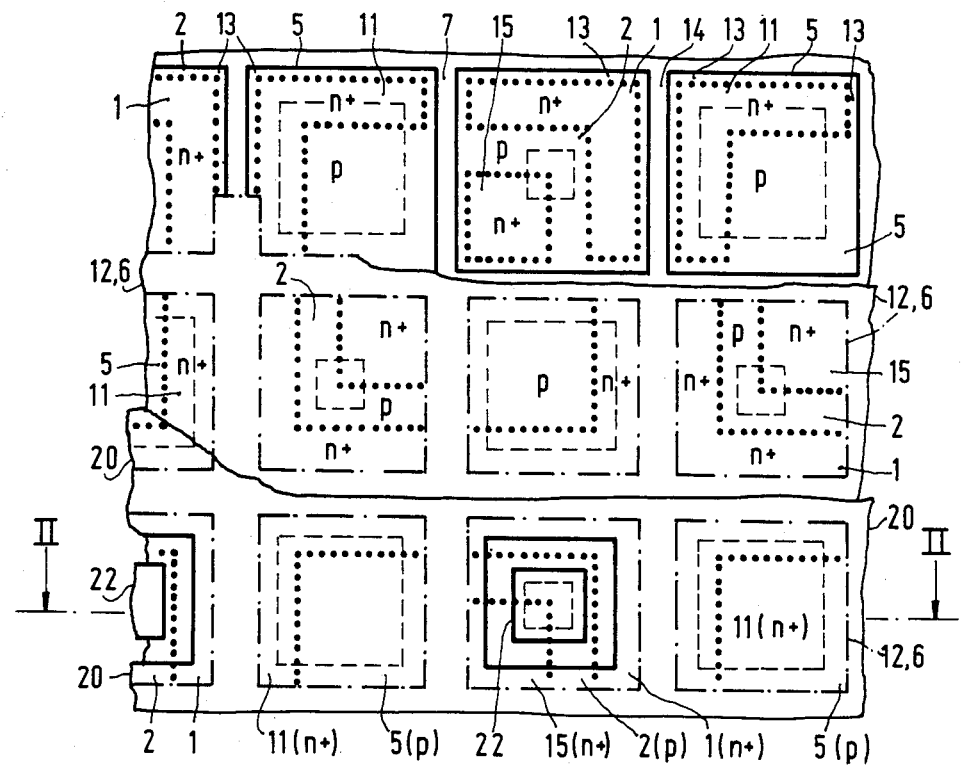
FIG. 1 is a plan view of part of a semiconductor device body of a device in accordance with the invention.
Figure 2:
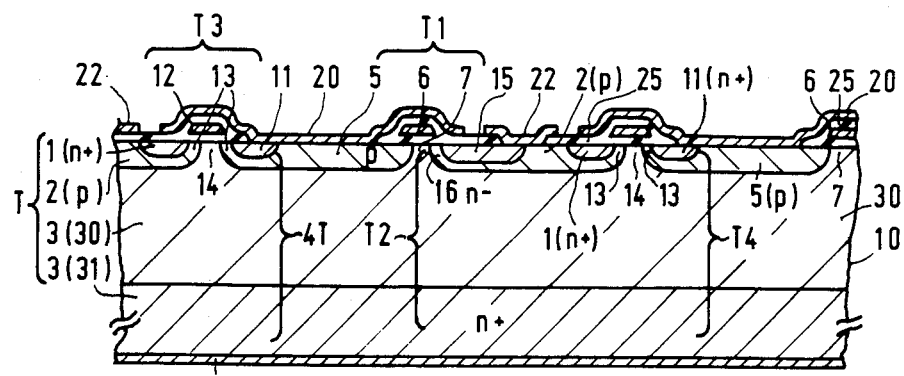
FIG. 2 is a cross-section on the line II—II of FIG. 1.
Figure 4:
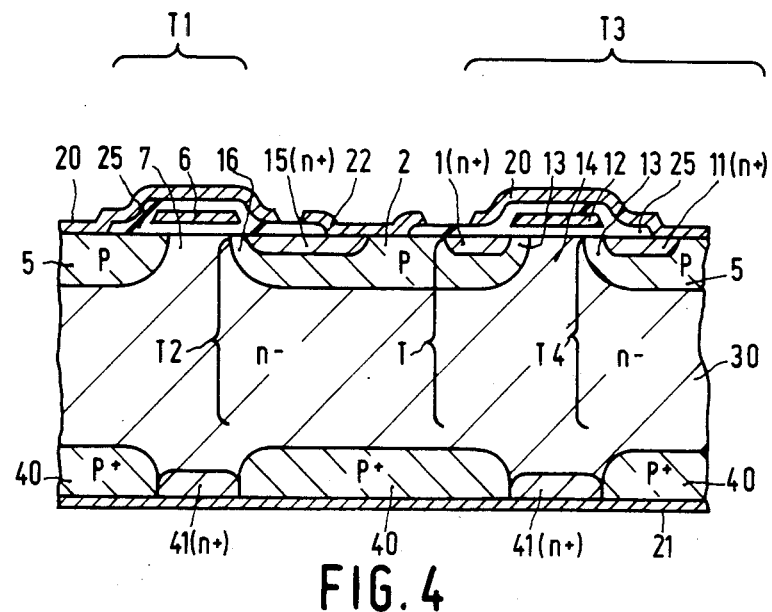
FIG. 4 is a cross-section of part of another semiconductor device in accordance with the invention.

It should be noted that FIGS. 1, 2 and 4 are diagrammatic and not drawn to scale. The relative dimensions and proportions of parts of these Figures (particularly in the direction of thickness in the cross-sections of FIGS. 2 and 4) have been shown exaggerated or diminished for the sake of clarity and convenience in the drawings. The same reference signs as used in one embodiment are generally used when referring to corresponding or similar parts in other embodiments.

DESCRIPTION OF THE PREFERRED EMBODIMENTS

Figure 3:
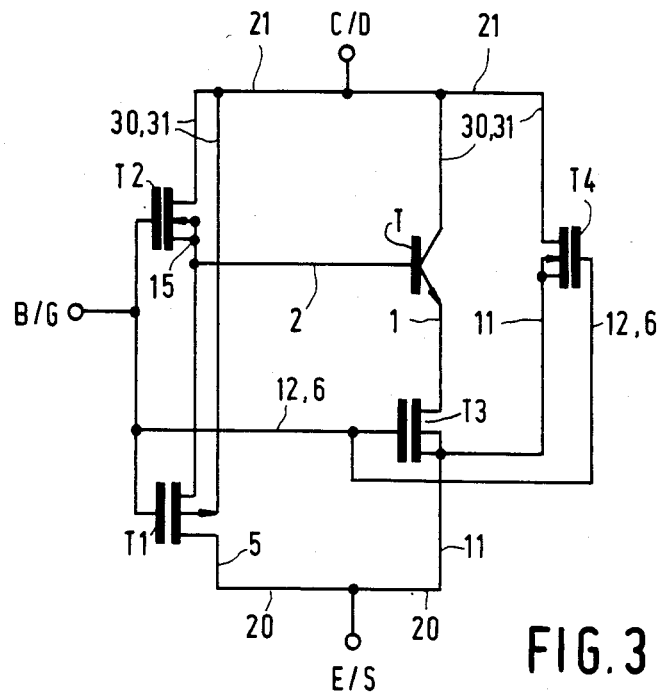
FIG. 3 is an equivalent circuit diagram of the integrated and merged circuit elements of such a semiconductor device in accordance with the invention.

The semiconductor device of FIGS. 1 and 2 comprises a bipolar transistor T of vertical configuration having an emitter region 1 of, for example, n type conductivity in a base region 2 of the opposite conductivity type (p type in this example). The base region 2 is provided in a higher resistivity body portion 30 of the first conductivity (n type) which forms a part of a collector region 3 of the bipolar transistor T. In the example of FIGS. 1 and 2 the collector region also comprises a highly-doped n type substrate 31 on which the body portion 30 is provided as an epitaxial layer. The device additionally comprises first, second, third and fourth insulated-gate field-effect transistors T1, T2, T3, T4 which are integrated and merged with the bipolar transistor T in the same semiconductor body 10 to form a device arrangement in accordance with the invention and with an equivalent circuit configuration as illustrated in FIG. 3.

In accordance with the present invention the device of FIGS. 1 and 2 is characterized in that the first field-effect transistor T1 has a drain region 5 of said opposite conductivity type (p type) in the body portion 30 beside the base region 2 and has an insulated gate 6 overlying a channel area 7 in a part of the body portion 30 between the drain region 5 and the base region 2, the adjacent part of which acts as the source of T1. The transistor T1 formed in this manner provides a charge extraction path from the base region 2 when the bipolar transistor T is turned off.

In addition to T1 the device further comprises in accordance with the invention a further insulated-gate field-effect transistor T3 which is of complementary conductivity type to the p channel first field-effect transistor T1 and which has a source region 11 of the first conductivity type (n type) beside the emitter region 1, the adjacent part of which acts as the drain of T3. This further transistor T3 has an insulated gate 12 over a channel area 13 between the emitter and source regions 1 and 11. In the Example of FIGS. 1 and 2, this channel area 13 comprises a portion of both the base region 2 and the drain region 5. The gate 12 of T3 is connected to the gate 6 of T1, permitting T1 to be turned on to extract charge from the base region 2 when T3 is turned off by a signal applied to its gate 12. As described below, the gates 6 and 12 in the example of FIGS. 1 and 2 are formed by a common grid of conductive material. The drain region 5 of T1 is connected to the source region 11 of T3.

As can be seen from FIGS. 1 and 2, the device comprises a compact two-dimensional array of alternating separate p type regions 2 and 5 side-by-side in the n type body portion 30. The source regions 11 of T3 are provided in the regions 5 which form the drain T1. The insulated gate 12 of T3 overlies both an intermediate part 14 of the body portion 30 between the regions 2 and 5 and the adjacent channel area 13 in the regions 2 and 5 to control current flow from the source regions 11 both laterally to the emitter regions 1 and vertically to the regions 30 and 31 which provide the collector 3 of T. Thus there is formed, in parallel with the bipolar transistor T, a vertical insulated-gate field-effect transistor having a gate 12, channel area 13, region 11 as its source, and regions 30 and 31 as its drain. The source regions 11 are connected to the region 5 by a conductive connection formed by metallization pattern 20. This provides a particularly efficient means of forming the connection between the source of T3 and the base of T1 at each cell of the array and also serves to suppress bipolar transistor action between the regions 11 and the body portion 30. By adjusting the relative areas of the regions 1 and 11 and the extent of the short-circuit connection across the p-n junction between regions 11 and 5, the device of FIGS. 1 and 2 can be designed so that the main current path through the device between terminals C/D and E/S in FIG. 3 is either by bipolar transistor action through T or FET action through T4 or is approximately equally divided between T and T4.

As can be seen from the circuit diagram of FIGS. 1 and 2, the first field-effect transistor T1 is one of a pair of first and second insulated-gate field-effect transistors which are of complementary conductivity type and which have a common gate connection to form a push-pull input stage the output of which is connected to the base region 2 of the bipolar transistor T. This second field-effect transistor T2 is of vertical configuration having (a) a drain region formed by a part of the n type regions 30 and 31, (b) a source region 15 of the same conductivity type (n type) provided in the base region 2 and connected to the base region 2 by a metallization pattern 22, and (c) an insulated gate 6 which overlies a channel area 16 of base region 2 between the body portion 30 and the source region 15 of T2. As illustrated in FIGS. 1 and 2, T2 is integrated and merged with the other transistors of the device in a very compact arrangement. The part of the base region 2 in which its source region 15 is provided also forms the source region of T1, and both T1 and T2 have a common insulated gate. This is much more compact than the integration of Q2 illustrated in FIG. 3 of the previously mentioned Chen and Chin paper.

In order to facilitate understanding of the layout of the device, different outlines have been used in the plan view of FIG. 1 and the upper layers have been shown cut-away from the upper rows of the array of FIG. 1. In the top row of FIG. 1 the alternating p type regions 2 and 5 are shown with continuous line boundaries (—); these boundaries are not depicted in the lower rows where they are beneath the grid of conductive gate material 12, 6. The boundaries of the n type regions 1, 11 and 15 provided in regions 2 and 5 are shown in dotted outline ( . . . ), except that the parts of these boundaries which are beneath the grid 12, 6 are not shown in the lower rows of FIG. 1. The boundaries of contact windows in an insulating layer 25 at the top surface of the semiconductor body 10 are shown in broken lines (- - -) in all rows of the array. The gate grid 12, 6 which is shown cut back from the top row in FIG. 1 is depicted with a line and dot boundary (-.-.-.). The top metallization patterns 20 and 22 which have been cut away from the top two rows of FIG. 1 are shown with a continuous outline (—).

As can be seen from FIG. 1 the base and drain regions 2 and 5 in this particular example are four-sided in plan view. The base charge extraction transistor T1 is formed along two adjacent sides of each of the drain regions 5, while the emitter gating transistor T3 is formed with its source region 11 along the other two adjacent sides of each of the regions 5. This provides a very compact array geometry, particularly as the second transistor T2 of the input stage pair is merged into the array by the provision of its source regions 15 at the adjacent sides of the base regions 2 facing the charge extraction transistor T1. If it is desired to increase further the efficiency of the vertical field-effect transistor T4 (in parallel with the bipolar transistor T) an additional n type source region which may be similar to region 15 can be provided at a part of the adjacent sides of the drain regions 5 where T1 is formed. The gates 12 and 6 of all the insulated-gate field-effect transistor T1 to T4 are formed in this particular example by a common rectangular grid of conductive material which extends on a part of the insulating layer 25 over the area between the base and drain regions 2 and 5.

The device of FIGS. 1 and 2 can be manufactured using known power semiconductor device technology, for example as used to manufacture power FETs of the so-called D-MOST type. The mask geometry used with the technology is adapted to produce the region layout of FIGS. 1 and 2. Thus, the body 10 may be of monocrystalline silicon, and the portion 30 may be grown as a high resistivity n type epitaxial layer on a highly doped n type substrate 31. An insulating layer 25 of silicon dioxide may be thermally grown on the surface of the epitaxial layer. Where the insulated gates are to be formed, the composition and thickness of the layer 25 is chosen to provide the desired gate dielectric for the transistor T1 to T4. The gate grid is formed on the layer 25 by deposition and patterning a suitable material such as polycrystalline silicon which may be doped either during or after deposition so as to render it conductive. The p type regions 2 and 5 may be formed in the epitaxial layer by, for example, boron ion implantation and/or diffusion. In known manner, the gate grid 12, 6 is used to mask this boron doping, thus defining the array of separate regions 2 and 5. The n type regions 1, 11 and 15 may be formed in the p type regions 2 and 5 by, for example, phosphorus or arsenic ion implantation and/or diffusion. This arsenic doping is masked by the gate grid 12, 6 and by a further masking pattern of, for example, photoresist which covers selected areas of the p type regions 2 and 5 within the apertures in the gate grid 2, 5.

The insulating layer 25 is then provided with contact windows as illustrated in broken lines (- - -) in FIG. 1. As shown in FIG. 1, there is a small window for contacting the base 2 of T and source 15 to T2 and a large window for contacting the drain 5 of T1 and the source 11 of T3. Conductive material, for example aluminum is then deposited and patterned to form the upper level metallization patterns, for example parts 20 and 22. Metallization 20 is in the form of a sheet which covers most of the upper surface of the device array and which contacts the top surface of the semiconductor body 10 at the large contact windows of the layer 25 so forming the emitter/source terminal connection (E/S) of the device as illustrated in FIG. 3. This metallization sheet 20 has apertures therein over the base region 2. The metallization pattern 22 is located within these apertures and contacts the top surface of the semiconductor body 10 at the small contact windows of the layer 25. There is no terminal connection to this metallization 22 which floats at its own potential as determined by the regions 2 and 15. There is a further part of the upper level metallization which provides a terminal connection B/G to the gate grid 12, 6 and which is not shown in FIG. 1 and 2. The bottom surface of the substrate 31 is coated with metallization 21 which provides terminal connection C/D of FIG. 3. In this manner a total device having just three terminal connections is obtained, the main current path being between E/S and C/D and being controlled by a signal applied to B/G.

The device of FIGS. 1 to 3 can be operated with its terminal C/D at a high positive potential with respect to its terminal E/S. By applying a positive potential to the control terminal B/G the gate grid 12, 6 is biased positive. Under these conditions T1 is off but T2 and T3 are turned on. With T2 on, current flows via the metallization short 22 from its source 15 to the base 2 of the bipolar transistor T. Simultaneously, the turning on of T3 completes the connection between terminal E/S and the emitter 1 of the bipolar transistor so completing the cascode connection of T and T3. The current path from T3 to terminal C/D is split between the vertical bipolar transistor T and the vertical insulated-gate field-effect transistor T4 connected in parallel with T. As already mentioned by adjusting the relative areas of the regions of T and T4 and the p-n junction short-circuits the device can be designed to have a particular desired degree of minority-carrier injection so that the device may be designed as a gated bipolar transistor or as a minority-carrier injected insulated-gate field-effect transistor depending on how much of the current is carried by T and T4 respectively.

By applying a negative (or low, depending on the FET threshold voltages) potential to the terminal B/G, the drive to the bipolar transistor T is removed by turning off T2; the gated connection to the emitter 1 of the bipolar transistor T and to the source 11 of the parallel FET T4 is also broken by turning off T3. Simultaneously the p channel FET T1 turns on, thus connecting together the base and drain regions 2 and 5 and allowing the minority carriers associated with the bipolar transistor action to be extracted from the base region 2 via the metallization 20. The width of the gap between the two p type regions 2 and 5 governs the degree of body-effect modulation of the threshold voltage of T1 during turn off. An efficient and rapid turn off of the device can be achieved by this cooperation of T1 and T3, because the conductive channels of T1 and T3 are directly coupled to the base and emitter regions 2 and 1 respectively by their insulated gates 6 and 12.

As compared with a simple bipolar transistor, the device of FIG. 1 and 2 has the advantages of a high input impedance resulting from the integration of the FET T2 and a fast turn off resulting from the integration of the base charge extraction FET T1 and the emitter gating FET T3. As compared with a simple insulated-gate FET, the device of FIGS. 1 and 2 has the advantage of minority carrier injection resulting from the integration of the bipolar transistor T which reduces the ON resistance. However the device arrangement is still very compact and is integrated in a single semiconductor body 10 with only three terminal connections.

FIG. 4 illustrates a modification in which the n type high resistivity body portion 30 is present between the p type base region 2 and an underlying p type anode region 40 which forms with the bipolar transistor T an n-p-n-p thyristor structure into which the insulated-gate field-effect transistors T1, T2, T3 and T4 are merged. The provision of the anode region 40 allows the bipolar section of the device to latch under forward conduction so that once turned on by a signal at terminal B/G, it can only be turned off by reducing the potential on terminal C/D. The provision of the emitter gating transistor T3 and the base charge extraction transistor T1 both merged into this thyristor structure in accordance with the invention has considerable advantages in forcing the turn-off of the thyristor. Also, to facilitate charge extraction from the body portion 30 adjacent the anode region 40 during turn off, the anode region 40 may comprise an array of apertures at which the bottom metallization 21 is connected to the body portion 30 via an array of n type contact regions 41 to short-circuit a part of the anode p-n junction. In this case, the portion 30 may be formed by the bulk of the body 10 (instead of by an epitaxial layer) and the regions 40 and 41 may be formed by dopant diffusion at its back surface.

It will be evident that many modifications are possible within the scope of the present invention. Thus, for example, although square regions 2 and 1 have been drawn in FIG. 5 for the sake of convenience in the drawing, it will often be advantageous to elongate the individual regions 2 and 5 in the array so as to increase further the area of the main current-carrying transistors T, T3 and T4 compared with the auxiliary transistors T1 and T2. Other nonrectangular geometries may also be used for the array, for example triangular and hexagonal geometries. In FIG. 1 a power transistor is obtained having all the different elements T and T1 to T4 formed with only two different p type regions 2 and 5. However devices in accordance with the present invention may be designed with a less compact geometry in which, for example, separate p type regions are used instead of a common region 5 for the drain T1 and for the channel area of T3. The input transistor T2 may also be omitted. Although the FETs illustrated in FIGS. 2 and 4 have their insulated gates at the top main surface of the body 10, at least some of these FETs may have insulated gates formed on the side-walls of grooves in the top main surface of the body 10.

What I claim is:

1. A semiconductor device comprising a vertical bipolar transistor having an emitter region of one conductivity type, a base region of the opposite conductivity type, and a higher resistivity body portion of the one conductivity type, the emitter region being provided in the base region and the base region being provided in the higher resistivity body portion of the one conductivity type, which body portion forms at least part of a collector region of the bipolar transistor, a first insulated-gate field-effect transistor connected to the base region, a further insulated-gate field-effect transistor which is of complementary conductivity type to that of the first field-effect transistor and which has a source region of the one conductivity type located adjacent the emitter region, the first field-effect transistor having a drain region of said opposite conductivity type in said body portion located adjacent the base region and having an insulated gate overlying a channel area in a part of said body portion between the base region and the drain region, the further field-effect transistor having an insulated gate over a channel area between the emitter and source regions to provide a gateable connection between the emitter and source regions, which channel area comprises a portion of at least the base region, and the gate of the further field-effect transistor being connected to the gate of the first field-effect transistor to permit the first field-effect transistor to be turned on during operation to extract charge from the base region when the further field-effect transistor is turned off by a signal applied to its gate.

2. A semiconductor device as claimed in claim 1, further wherein the first field-effect transistor is one of a pair of first and second insulated-gate field-effect transistors which are of complementary conductivity type to each other, said further field-effect transistor is a third field-effect transistor of the device, the first and second field-effect transistors have a common gate connection to form a push-pull input stage connected to the base region of the bipolar transistor, and the second field-effect transistor is of vertical configuration having a drain region formed by at least part of the collector region, a source region of the one conductivity type provided in the base region and connected to the base region by a conductive connection, and an insulated gate overlying a channel area of the base region between said body portion and the source region of the second field-effect transistor.

3. A semiconductor device as claimed in claim 2, wherein the part of the base region in which the source region of the second field-effect transistor is provided also forms the source region of the first field-effect transistor, and both the first and second transistors have a common insulated gate.

4. A semiconductor device as claimed in claim 2 or claim 3, further comprising a further region of said opposite conductivity type, wherein the source region of the third field-effect transistor is provided in said further region of said opposite conductivity type which is located beside the base region and which is separated from the base region by an intermediate part of said body portion, and the insulated gate of the third field-effect transistor overlies this intermediate part of the body portion as well as an adjacent channel area in said further and base regions to control current flow from the source region both laterally to the emitter region and vertically to the collector region, thereby forming a vertical insulated-gate field-effect transistor in parallel with the bipolar transistor.

5. A semiconductor device as claimed in claim 4, wherein the source region of the third transistor is connected to said further region by a conductive connection to suppress bipolar transistor action between the source region and the body portion.

6. A semiconductor device as claimed in claim 4, wherein said other region is formed by a part of the drain region of the first field-effect transistor.

7. A semiconductor device as claimed in claim 6, wherein an array of alternating base regions of the bipolar transistor and drain regions of the first field-effect transistor are provided in the body portion, and the first and third field-effect transistors are formed at different sides of each drain region and have insulated gates formed by a common grid of conductive material which extends on an insulating layer over the area between said base and drain regions of the array.

8. A semiconductor device as claimed in claim 7, wherein said base and drain regions of the array are each four-sided in plan view, the first field-effect transistor is formed along two adjacent sides of each of said drain regions, and the third field-effect transistor is formed with its source region along the other two adjacent sides of each of said drain regions.

9. A semiconductor device as claimed in claim 1, further comprising an underlying region of said opposite conductivity type, wherein the body portion of the one conductivity type is present between the base region and said underlying region of said opposite conductivity type which forms with the bipolar transistor an n-p-n-p thyristor structure.

* * * * *

UNITED STATES PATENT AND TRADEMARK OFFICE
CERTIFICATE OF CORRECTION

PATENT NO. : 4,729,007
DATED : March 1, 1988
INVENTOR(S) : David J. Coe

It is certified that error appears in the above-identified patent and that said Letters Patent is hereby corrected as shown below:

Claim 2, line 2  delete "further"

Signed and Sealed this

Twenty-second Day of November, 1988

Attest:

DONALD J. QUIGG

Attesting Officer     Commissioner of Patents and Trademarks